(12) United States Patent
Cornwell

(10) Patent No.: US 7,103,552 B2
(45) Date of Patent: Sep. 5, 2006

(54) MULTI-MESSAGE AUDIO RECORDER AND MEMENTO

(75) Inventor: Phillip R. Cornwell, Seymour, IN (US)

(73) Assignee: My Great Memories, Inc., Seymouur, IN (US)

( * ) Notice: Subject to any disclaimer, the term of this patent is extended or adjusted under 35 U.S.C. 154(b) by 911 days.

(21) Appl. No.: 10/157,344

(22) Filed: May 29, 2002

(65) Prior Publication Data

US 2003/0223730 A1    Dec. 4, 2003

(51) Int. Cl.
*G10L 21/00*      (2006.01)
(52) U.S. Cl. ..................................... 704/272
(58) Field of Classification Search ...................... None
See application file for complete search history.

(56) References Cited

U.S. PATENT DOCUMENTS

| | | | |
|---|---|---|---|
| 5,774,039 A * | 6/1998 | Housley | 340/326 |
| 6,590,837 B1 * | 7/2003 | Kaplan | 369/25.01 |
| 6,591,526 B1 * | 7/2003 | Garrett | 40/455 |
| 6,760,696 B1 * | 7/2004 | Goldberg et al. | 704/201 |
| 6,980,120 B1 * | 12/2005 | Yu et al. | 340/825.69 |

\* cited by examiner

*Primary Examiner*—Susan McFadden
(74) *Attorney, Agent, or Firm*—Woodard, Emhardt, Moriarty, McNett & Henry LLP

(57) ABSTRACT

A combination memento and voice recorder. A box includes a mount removably holding a memento. A voice recorder is mounted within a box to record a message thereon. An internal cover mounted in the box conceals the voice recorder while allowing access to playback.

12 Claims, 4 Drawing Sheets

MULTI-MESSAGE AUDIO RECORDER AND MEMENTO

BACKGROUND OF THE INVENTION

The present invention relates generally to the field of audio recorders.

DESCRIPTION OF THE PRIOR ART

Solid state chips are commercially available for recording audio thereby allowing for the miniaturization and compact packaging of the audio recorder. Audio recorders may be used to record voices for posterity allowing playback many years after the original recording. Such is particularly advantageous for recording the voice of one generation for a succeeding generation. In order to provide an attractive gift, disclosed herein is a combined package of a miniaturized audio recorder with a memento or souvenir with the combination to be gifted from one person to another. A message of the donor may thereby be included in the recorder to be played back in subsequent years. The attractiveness of the gift is increased since the recorder has a multiple recording capability to preserve the voices from multiple generations. The package is designed to prevent accidental erasing or re-recording of the preserved voices through the concealment of the recording switch and the inclusion of a separate lock switch for each voice recorded

SUMMARY OF THE INVENTION

On embodiment of the present invention is a combination memento and recorder to record voice comprising a box, a memento, a mount within the box holding the memento, and an audio recorder. The recorder includes a voice receiver, a battery, a voice-recordable, solid-state device connected to the battery to record voice, a record switch connected to the device, a play switch connected to the device to allow voice playback of the voice, and an on/off switch connecting the device to the battery to allow recording of the voice from the voice receiver and to be gifted with the memento all in the box. An internal cover is mounted in the box and positioned over the recorder to conceal the record switch while revealing the play switch and the on/off switch allowing playback of the voice while limiting re-recording over the voice.

It is an object of the present invention to provide a new and improved audio recorder.

A further object of the present invention is to provide a combination memento and voice recorder packaged as a gift and capable of recording voices from multiple generations.

Yet an additional object of the present invention is to provide an audio recorder having a solid-state recording chip with provisions to prevent accidental erasing or re-recording of previously recorded voices.

Related objects and advantages of the present invention will be apparent from the following description.

DESCRIPTION OF THE PREFERRED EMBODIMENTS

Figure 1:
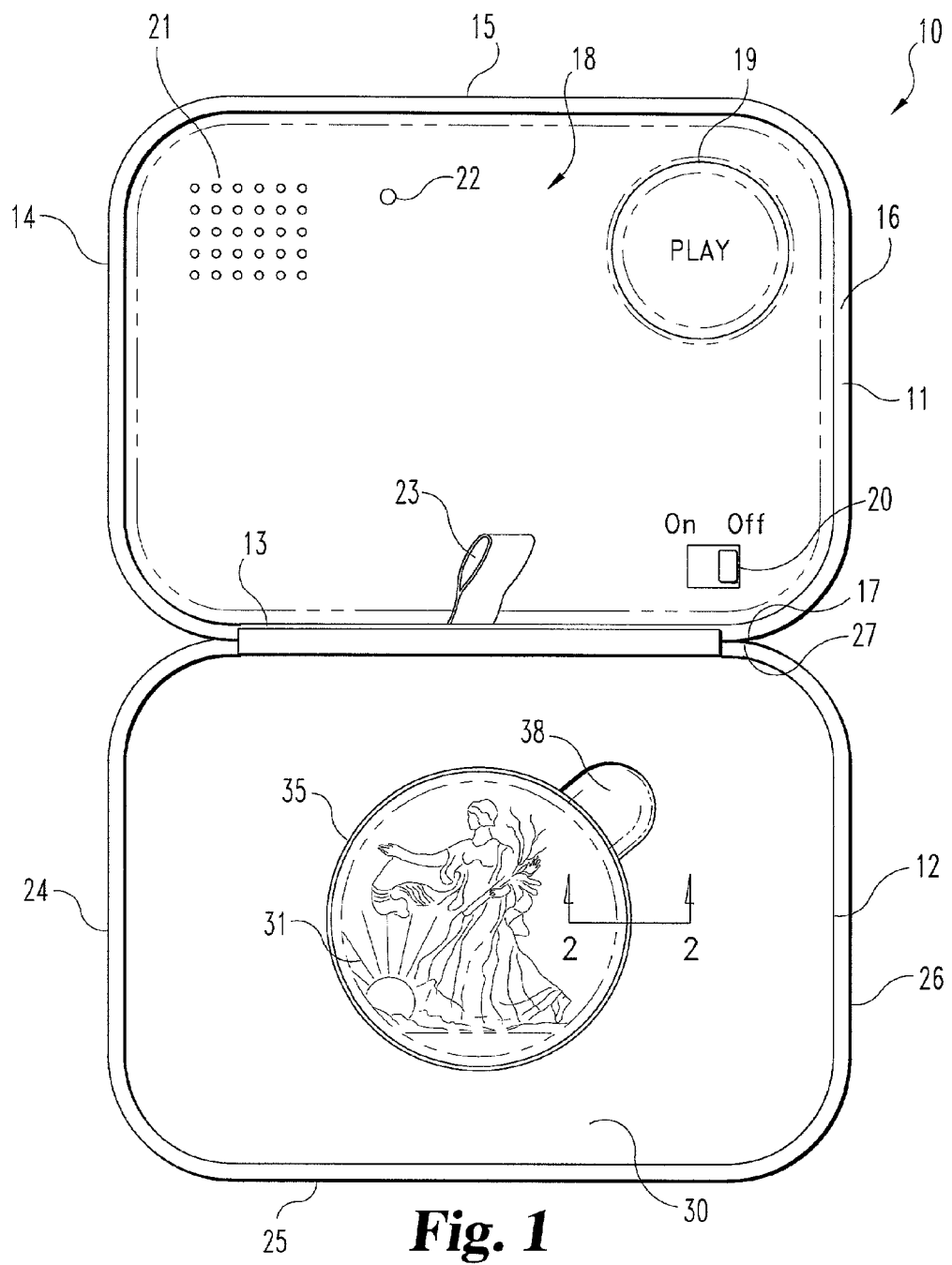
FIG. 1 is a plan view of the preferred embodiment of the combination memento and audio recorder incorporating the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now particularly to FIG. 1, there is illustrated a combination memento and audio recorder 10 configured as a box having a top portion 11 and bottom portion 12 connected together by conventional hinge 13, such as a plastic living hinge or metal piano hinge. The box may be constructed as a conventional jewelry box for holding rings, watches, etc. The top portion 11 includes four sidewalls 14–17 connected together and extending outwardly from a bottom wall to hold a miniaturized audio recorder. A removable cover 18 is mounted to top portion 11 and conceals the audio recorder except for the play switch 19 and the on/off switch 20. A first series of apertures 21 and a second aperture 22 are aligned with the voice speaker and voice receiver of the audio recorder located beneath cover 18. A fabric tab 23 is fixedly attached to cover 18 to assist in removal of the cover allowing access to the audio recorder.

Figure 2:
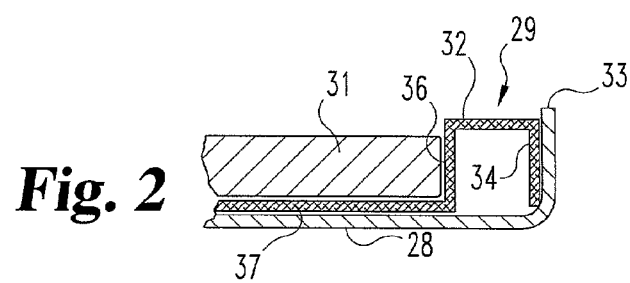
FIG. 2 is a reduced, fragmentary cross-sectional view taken along the line 2—2 of FIG. 1 and viewed in the direction of the arrow.

The bottom portion 12 of the box likewise has four sidewalls 24–27 joined together and to a bottom wall 28 (FIG. 2) in a rectangular configuration forming a cavity 29 into which a memento or souvenir may be mounted. In the preferred embodiment, both the top portion 11 and bottom portion 12 are produced from metal with cover 18 and mounting wall 30 being produced from a felt covered plastic or paperboard.

Figure 3:
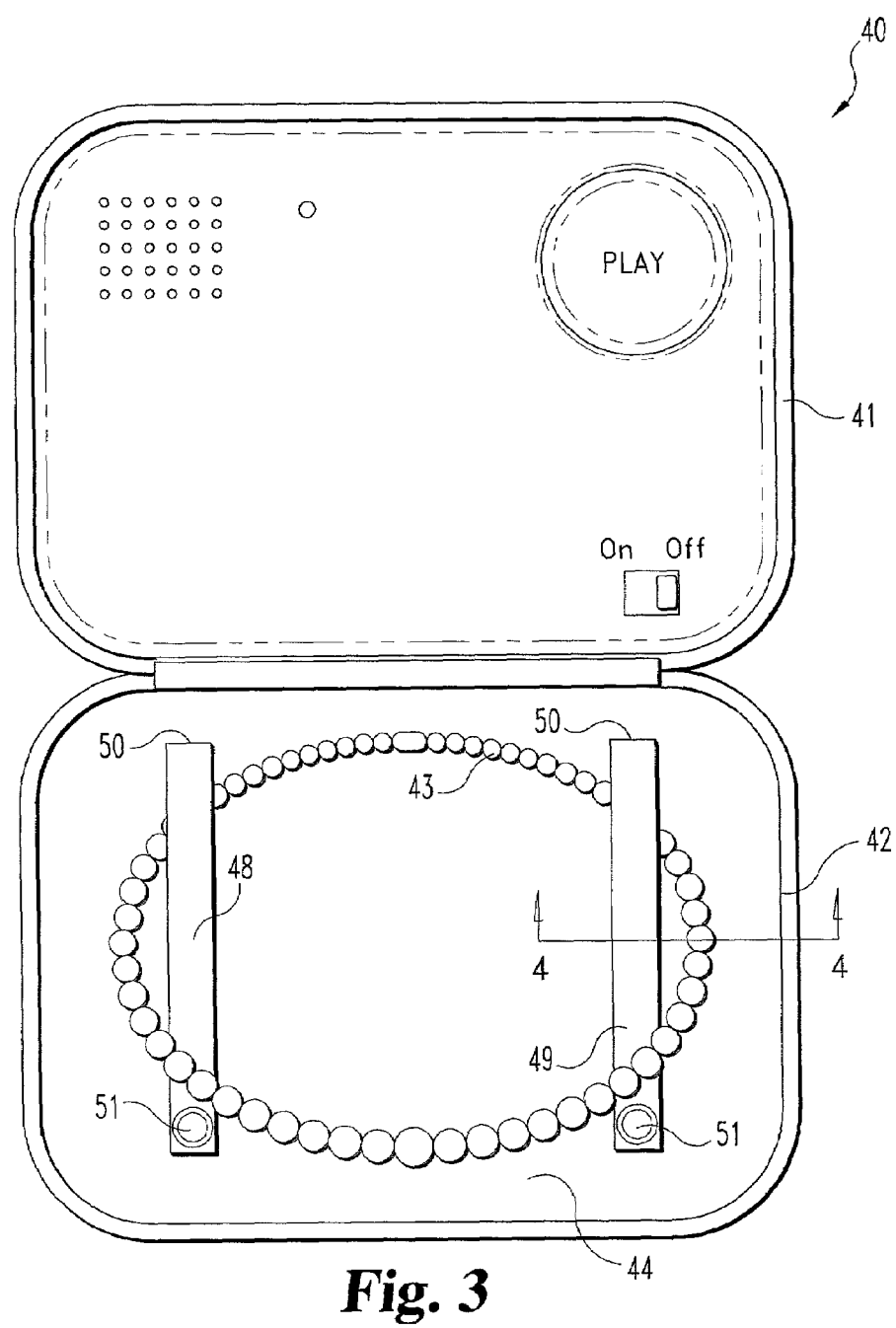
FIG. 3 is a plan view of an alternate embodiment of the combination memento and audio recorder.
Figure 4:
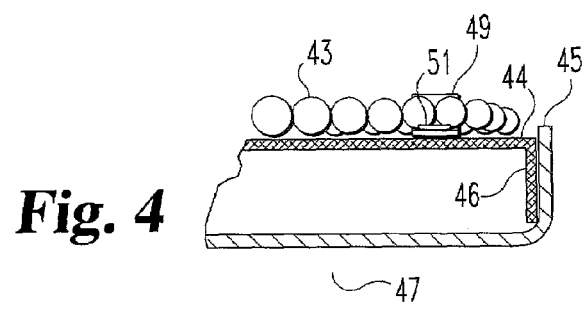
FIG. 4 is a reduced fragmentary cross-sectional view taken along the line 4—4 of FIG. 3 and viewed in the direction of the arrows.

The alternate embodiment of the combination memento and audio recorder is shown in FIG. 3 and is identical to the combination memento and audio recorder 10 of FIG. 1 with exception of the mount utilized to removably hold the memento. Thus, the combination memento and audio recorder 40 includes a box with a top portion 41 and bottom portion 42 hingedly connected together. Top portion 41 includes the audio recorder and cover identical to the audio recorder and cover provided in top portion 11. Bottom portion 12 is designed to removably hold a coin 31 whereas bottom portion 42 is designed to removably hold a piece of jewelry, such as a necklace 43.

Mount 30 (FIGS. 1 and 2) consists of a wall 32 arranged generally flush with the top edge 33 of the four sidewalls of bottom portion 12. Wall 32 may be turned downwardly forming wall 34 continuously extending along and surrounding the periphery or outer edge of wall 32 with wall 34 having a bottom edge resting atop bottom wall 28 of bottom portion 12 thereby supporting wall 32 upwardly therefrom. A circular recess 35 is formed in wall 32 and is centrally located with respect to the sidewalls of bottom portion 12. Wall 32 extends downwardly forming a cylindrical sidewall 36 forming the recess 35 and is joined to wall portion 37 of wall 32. Portion 37 is downwardly offset resting atop bottom wall 28 to support the coin 31 positioned atop portion 37 and located within circular recess 35. The diameter of the recess 35 formed by wall 36 is slightly less than the diameter of coin 31 thereby causing wall 36 to frictionally engage the circumferentially extending edge of the coin. A finger recess 38 is formed in wall 32 and opens into recess 35 allowing a finger to extend against coin 31 in order to remove the coin from the box. Coin 31 may be a collector edition and may be specially plated and encapsulated in plastic. Gold plated silver dollars are particularly attractive when positioned in recess 35.

Wall 44 contained in bottom portion 42 of the alternate embodiment shown in FIG. 3 extends across the width and length of bottom portion 42 and is generally flush with the top edge 45 of the surrounding side walls. As is the case with wall 32, wall 44 includes a downwardly extending wall or leg 46 that extends parallel to the side walls of bottom portion 42 and continuously around the length and width or periphery of wall 44 and rests atop wall 47 thereby supporting wall 44 above the bottom wall 47 of the box. A pair of strips 48 and 49 each have proximal ends 50 hingedly joined to wall 44 enabling strips 48 and 49 to be pivoted and lifted upwardly locating at least a portion of necklace 43 between the strips and wall 44. The opposite distal ends of strips 48 and 49 include conventional snap fasteners 51 to releasably engage with mating snap fasteners provided therebeneath on wall 44, thereby allowing each strip to be locked in place once the necklace has been mounted.

Further alternate embodiments include mounting clips to wall 44 to releasably hold the jewelry secured therein. Likewise, the present invention includes alternative mounting means such as recesses formed in wall 44 to mountingly receive a piece of jewelry such as a ring. An additional embodiment includes providing an oval wall generally perpendicular to and extending above wall 44 for releasably receiving and holding a watch.

The box may be closed so that the two portions 11/12 or 41/42 are positioned in a side by side relationship relative to each other thereby concealing the memento and play switch.

Figure 5:
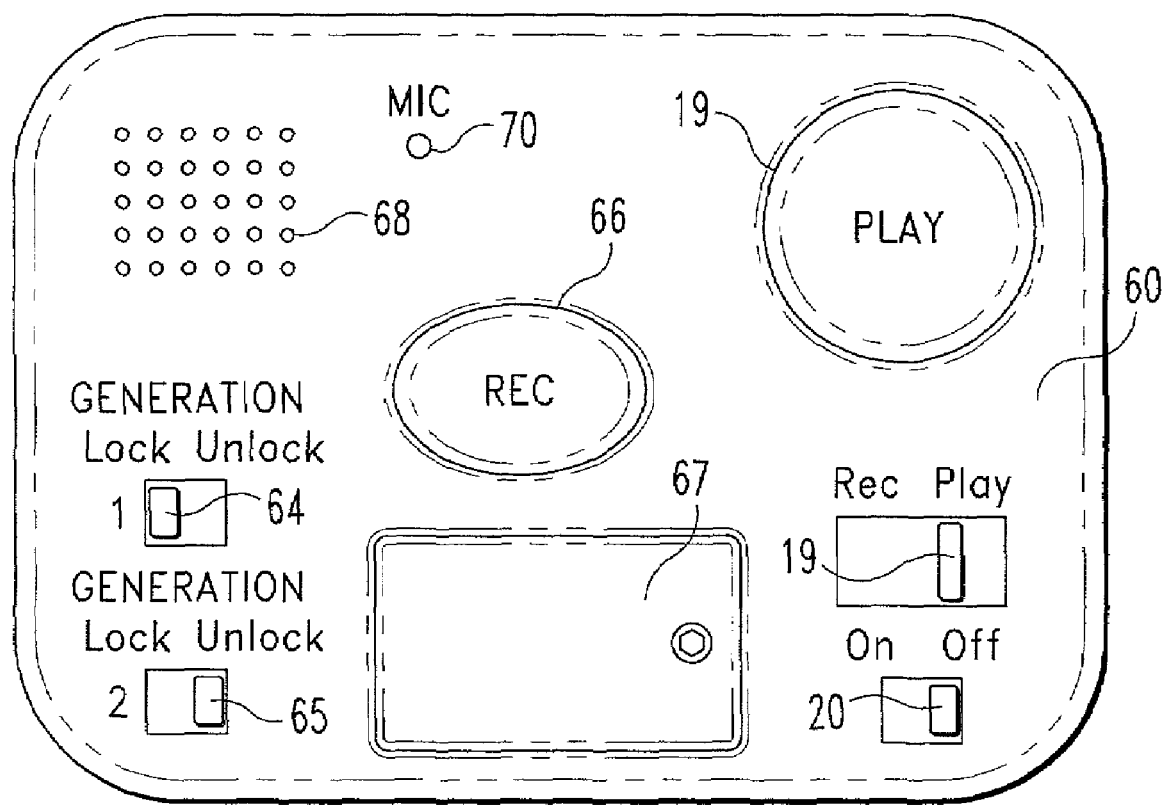
FIG. 5 is a plan view of the audio recorder included in the embodiments of FIGS. 1 and 3.
Figure 6:
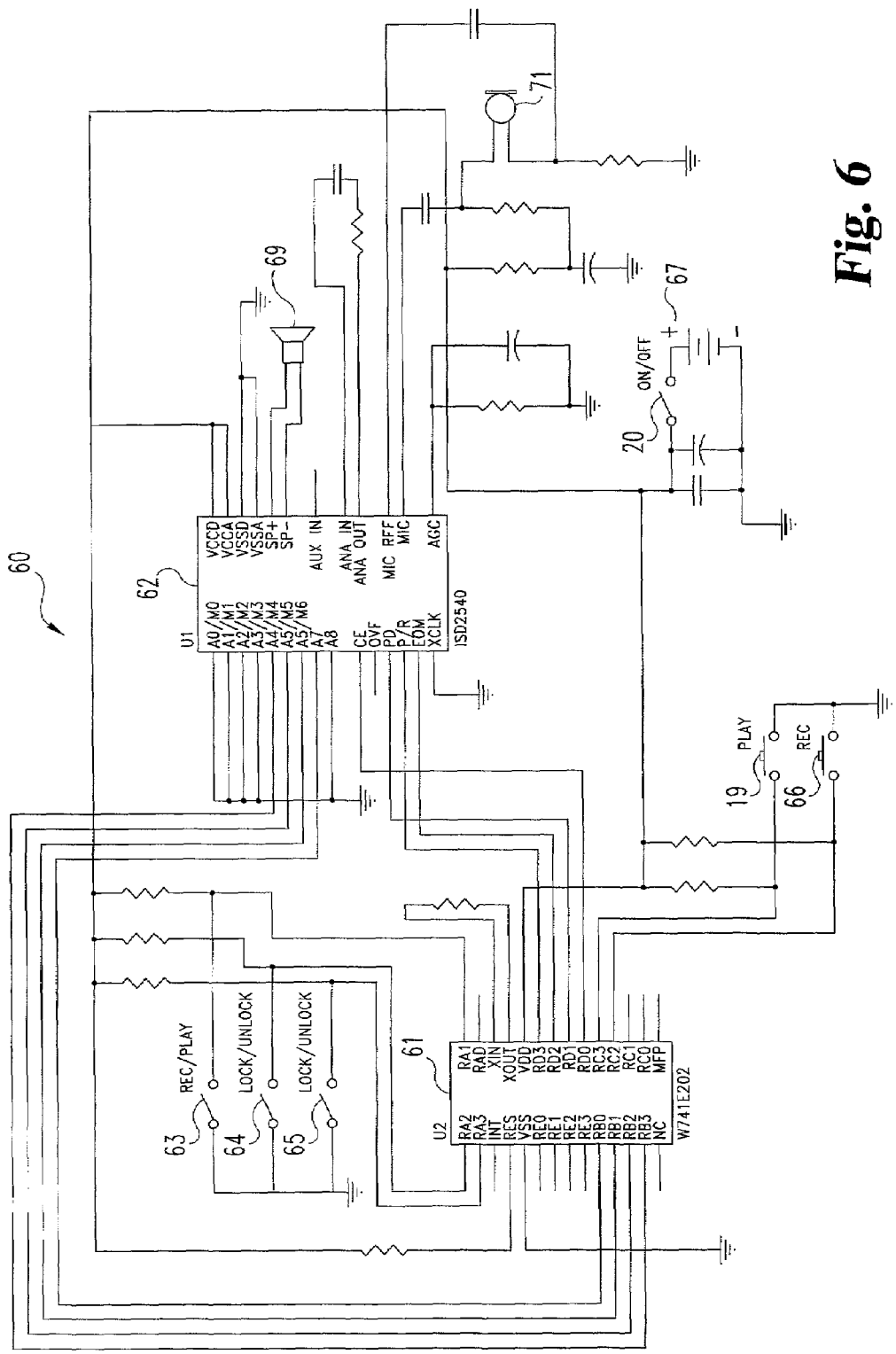
FIG. 6 is a schematic representation of the audio recorder of FIG. 5.

A front view of the audio recorder 60 is depicted in FIG. 5 along with a schematic representation in FIG. 6. Recorder 60 (FIG. 6) includes a voice recordable solid-state chip 61 and a second solid state chip 62. Chip 61 and 62 are commercially available from WINBOND under part numbers, respectively ISD2540 (die form) and W741E202 (dip type). Recorder 60 includes an on and off switch 20 (FIGS. 5 and 6, and record/play switch 63, a first lock/unlock switch 64 and a second lock/unlock switch 65. A record switch 66 is provided on the front face of the recorder along with play switch 19. The recorder includes a removable door 67 (FIG. 5) to allow access for removal and installation of a fresh 6-volt battery 67 (FIG. 6). A series of apertures 68 are provided through which sound may be emitted by speaker 69. Likewise, an aperture 70 is provided on the audio recorder through which sound may pass to microphone 71.

The 6-volt battery 67 is connected to solid state chips 61 and 62 with the on/off switch 20 being disposed therebetween. Speaker 69 and microphone 71 are connected to chip 62, in turn, connected to chip 61 for receiving a pair of separate voice recordings from the microphone. The play switch 19 is connected to chip 61 to activate the chip and allow recording of a voice message. Likewise, record switch 66 is connected to chip 61 and allows for the playback of the particular message. Prior to depressing either switch 19 or 66, it is first necessary to place switch 63 in either the record or play position. Switch 63 is connected to chip 61 and in one condition allows for the activation for the record switch 66 whereas in a second position allows for activation of play switch 19. In order to prevent the accidental re-recording over a message, a pair of lock/unlock switches 64 and 65 are connected to chip 61. In one position, switch 64 unlocks the chip so that a first message may be recorded thereon. With switch 64 then in a second position, the chip is locked to prevent re-recording over the first message. Likewise, when in a first position, switch 65 allows for recording of a second message on the chip, whereas with switch 65 in a second position, it is not possible to re-record over the second message. The solid state device and lock/unlocked switches 64 and 65 are arranged so that it is not possible to record the second message over the first message. In other words, the device includes at least two separate recording capabilities.

Removable cover 18 (FIG. 1) extends over the audio recorder and normally allows access only to play button 19 and on/off switch 20. In order to record the first voice message on the recorder, it is necessary to remove cover 18 and position switch 64 in the unlocked position and switch 65 in the locked position with the record switch 66 then being depressed once switch 63 is moved to the record position. Upon completion of the message, switch 66 may be released and switch 64 moved to the locked position. Cover 18 may then be reinstalled over the audio recorder preventing immediate access to switch 66 and switch 64 thereby preventing accidental re-recording of a new message over the message just recorded. In similar fashion, a second message may be provided on the recorder by removing cover 18 and moving switch 65 to the unlocked position while switch 64 remains locked. Once a message or messages are recorded, the switch 63 is moved to the record position to allow playback via switch 19. Cover 18 includes openings through which switches 19 and 20 project to allow access at all times to the user who may turn on or off the recorder and play the message at any time. In the event, a pair of messages have been recorded, then the messages may be played in sequential fashion. Thus, a person from one generation may record his/her voice and gift the combination memento and record to a second generation person who, in turn, may record his/her voice and gift the combination memento and recorder to a third generation person.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A combination memento and voice recorder to record voice comprising:
    a box;
    a memento;
    a mount within said box holding said memento;
    a voice recorder mounted in said box, said recorder including a voice receiver, a battery, a voice-recordable, solid-state device connected to said battery to record a first voice, a record switch connected to said device, a play switch connected to said device to allow voice playback of the first voice, an on/off switch connecting said device to said battery to allow recording of the first voice from said voice receiver and to be gifted with said memento all in said box; and,
    an internal cover mounted in said box and positioned over said voice recorder to conceal said record switch while revealing said play switch and said on/off switch allowing playback of said first voice while limiting re-recording over said first voice, and, wherein:

said voice-recordable, solid-state device connected to said battery and to said record switch and said play switch allows recording and voice playback of a second voice;

a first lock switch connected to said device to limit re-recording over said first voice; and, a second lock switch connected to said device to limit re-recording over said second voice;

said box includes a first portion and a second portion mateable together with said memento with said mount located in said first portion and said voice recorder and said internal cover located in said second portion, said first portion and said second portion when positioned in side by side relationship relative to each other concealing said memento, said mount, said internal cover and said voice recorder and when moved apart revealing said memento and said play switch.

2. The combination memento and voice recorder of claim 1 wherein:

said mount includes an inwardly facing, circular, friction surface defining a circular recess; and, said memento is a coin positioned within said recess and held therein by said friction surface.

3. The combination memento and voice recorder of claim 2 wherein:

said voice recorder includes voice pick-up means.

4. The combination memento and voice recorder of claim 3 and further comprising:

a voice speaker, and wherein said internal cover includes a first hole and a second hole extending therethrough and aligned with respectively said play switch and said voice speaker; and, a play/record switch to selectively enable said play switch and said record switch.

5. The combination memento and voice recorder of claim 1 and further comprising:

said mount includes a pair of strips including proximal ends hingedly connected to said mount and distal ends releasably connected to said mount; and, said memento is jewelry positioned between said mount and said strips.

6. A box comprising;

a first housing;

a second housing mateable together with said first housing;

a hinge connecting said first housing and second housing together and allowing said first housing to pivot open and pivot close relative to said second housing;

a voice recorder positioned and mounted in said first housing and having a playback switch and a voice speaker;

an internal cover positioned in and mounted to said first housing and concealing at least a portion of said voice recorder but allowing access to said playback switch and sound from said voice speaker to extend therethrough;

a mount positioned in said second housing; and, a memento positioned in said second housing and secured to said mount and facing outwardly; and wherein:

said first housing and said second housing when positioned in side by side relationship to each other concealing and memento, said mount, said internal cover and said voice recorder and when moved apart revealing said playback switch.

7. The box of claim 6 wherein:

said first housing and said second housing each includes a recess to receive respectively said voice recorder and said memento.

8. The box of claim 6 wherein:

said voice recorder includes a battery, a voice-recordable, solid-state device connected to said battery, a record switch connected to said device to allow a first voice recording thereon, a voice receiver and a voice speaker connected to said device to allow respectively receipt by said device of voice and playback of voice, a first lock switch connected to said device to limit re-recording of voice thereon, and an on/off switch connecting said battery and said device together to limit battery drain.

9. The box of claim 8 wherein:

said voice recorder includes a second lock switch connected to said device to limit re-recording of voice thereon.

10. The box of claim 9 wherein:

said internal cover is removably mounted to said first housing, said internal cover includes an access hole aligned with said playback switch to allow access thereof, said internal cover conceals said record switch, said first lock switch and said second lock switch but includes a tab that extends outwardly therefrom to allow grasping and pulling of said internal cover from said first housing and access to said voice recorder.

11. The box of claim 6 wherein:

said mount is a wall mounted to and extending across said second housing, said wall has a continuous, inwardly facing, circular friction surface; and, said memento is a coin removably mounted to said wall and is held thereto by said friction surface.

12. A combination coin and voice recorder comprising:

a box having a housing and a removable lid matable together;

a coin removably mounted within the box;

a voice recorder mounted within the box and including a speaker, a microphone, a battery, a solid state device for recording voice thereon, a record switch and a play switch for respectively recording and playing; and, an internal cover removably mounted in the box and concealing at least a portion of said voice recorder while allowing access at all times to said play switch, and wherein:

said housing and said lid when positioned in side by side relationship relative to each other concealing said coin, said voice recorder and said internal cover and when moved apart revealing said coin and said play switch.

* * * * *